(12) United States Patent
Takahashi

(10) Patent No.: US 6,999,123 B1
(45) Date of Patent: Feb. 14, 2006

(54) METHOD AND APPARATUS FOR DRIVING SOLID STATE IMAGE SENSOR

(75) Inventor: Tatsuya Takahashi, Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/426,991

(22) Filed: Oct. 26, 1999

(30) Foreign Application Priority Data

Oct. 27, 1998 (JP) .................................. 10-305820

(51) Int. Cl.
*H04N 5/335* (2006.01)

(52) U.S. Cl. ...................... 348/312; 348/296; 348/314

(58) Field of Classification Search .............. 348/312, 348/296, 297, 298, 314, 317, 320, 322, 372; 371/57
See application file for complete search history.

(56) References Cited

U.S. PATENT DOCUMENTS

| | | | | |
|---|---|---|---|---|
| 4,281,339 A | * | 7/1981 | Morishita et al. ........... 348/236 |
| 4,769,709 A | | 9/1988 | Van de Steeg | |
| 5,144,445 A | * | 9/1992 | Higashitsutsumi ........... 348/294 |
| 5,625,414 A | * | 4/1997 | Manning ..................... 348/312 |
| 5,745,808 A | * | 4/1998 | Tintera ....................... 396/236 |
| 5,796,432 A | * | 8/1998 | Iesaka et al. ............... 348/311 |
| 6,229,567 B1 | * | 5/2001 | Park et al. .................. 348/315 |
| 6,351,284 B1 | * | 2/2002 | Watanabe et al. ........... 348/312 |
| 6,545,713 B1 | * | 4/2003 | Watanabe .................... 348/311 |
| 2003/0122947 A1 | | 7/2003 | Ishimoto | |

FOREIGN PATENT DOCUMENTS

| JP | 63-50059 | | 3/1988 |
|---|---|---|---|
| JP | 09168118 A | * | 6/1997 |
| JP | 10-164439 | | 6/1998 |

* cited by examiner

*Primary Examiner*—James J. Groody
*Assistant Examiner*—Lin Ye
(74) *Attorney, Agent, or Firm*—Sheridan Ross PC

(57) ABSTRACT

An image sensing device includes a solid state image sensor, such as a CCD. An electronic shutter controls the exposure of the sensor to light, and thus the period during which the sensor collects or accumulates an information charge with light receiving pixels. The image sensor includes a semiconductor substrate, a semiconductor layer having parallel channel regions formed on the substrate, and transfer electrodes which intersect the channel regions. The channel regions generate and store the information charges.

7 Claims, 5 Drawing Sheets

From flame transfer completion to shutter operation completion

From shutter operation completion to flame transfer completion

METHOD AND APPARATUS FOR DRIVING SOLID STATE IMAGE SENSOR

BACKGROUND OF THE INVENTION

The present invention relates to a method and apparatus for driving a solid state image sensor which operates an electronic shutter.

An image sensing apparatus which has a solid state image sensor, like a CCD (Charge Coupled Device), controls the exposure of the solid state image sensor to achieve an optimal exposure state. This exposure control uses an iris mechanism which mechanically controls the amount of incident light to the solid state image sensor in accordance with the luminance of light reflected from a target object. Alternatively, the exposure control can use a so-called electronic shutter which controls the period the solid state image sensor accumlates a charge in accordance with the luminance of light reflected from the target object. The solid state image sensor has light-receiving pixels arranged in a matrix form, which stores (accumlates) information charges that are generated in accordance with the incident light.

FIG. 1 is a block diagram showing the structure of a prior art solid state image sensor, and FIG. 2 is a timing chart showing the operation of the prior art solid state image sensor. Referring to FIG. 1, a frame transferring type CCD solid state image sensor 1 includes a light-receiving section 1$i$, a storing section 1$s$, a horizontal transferring section 1$h$, and an output section 1$d$. The light receiving section 1$i$ has a plurality of parallel transfer registers arranged continuously in the vertical direction. A plurality of light-receiving pixels are formed by each bit of the transfer registers. When the light from a target object irradiates the light-receiving pixels, each light-receiving pixel generates and stores a charge corresponding to the image of the target object. The storing section is has a plurality of transfer registers continuing from the transfer registers of the light-receiving section 1$i$. The number of bits of each transfer register of the storing section is 1$s$ the same as that of each transfer register (shift register) of the light-receiving portion 1$i$. The storing section is temporarily stores information charges corresponding to a single display image output by the light-receiving section 1$i$. The horizontal transfer section 1$h$ has a single horizontal transfer register. Each bit of the horizontal transfer register is connected to the transfer registers of the storing section is. The horizontal transfer section 1$h$ receives the stored information charges, which correspond to the display image, from the storing section is in units of single lines and sequentially transfers the single line units to the output section 1$d$. The output section 1$d$ has an electrically independent capacitor and an amplifier, which eliminate potential changes at the output section 1$d$. The output section 1$d$ receives the information charges serially from the horizontal transfer section 1$h$ in single line units and converts the information charges to a voltage value and then outputs an image signal Y(t).

A clock generator 2 generates a multi-phase vertical transfer clock $\phi$v, a storage transfer clock $\phi$s, and a horizontal transfer clock $\phi$h in response to horizontal and vertical timing signals HT, VT. The vertical transfer clock $\phi$v is sent to the light-receiving section 1$i$ of the solid state image sensor 1, the storage transfer clock $\phi$s is sent to the storage section 1$s$, and the horizontal transfer clock $\phi$h is sent to the horizontal transfer section 1$h$.

When the light-receiving section 1$i$ receives the vertical transfer clock $\phi$v, the stored information charges in each light-receiving pixel of the light-receiving section 1$i$ are transferred to the storage section is. This is the vertical scanning return period. When the storage section is receives the storage transfer clock $\phi$s, the information charges transferred from the light-receiving section 1$i$ in accordance with the vertical transfer clock $\phi$v are acquired by the storage section 1$s$. Additionally, the acquired information charges are transferred to the horizontal transfer section 1$h$ one line at a time. The information charges transferred to the horizontal transfer section 1$h$ one line at a time in accordance with the storage transfer clock $\phi$s are further transferred to the output section 1$d$, sequentially. The clock generator 2 also generates a substrate clock $\phi$b which rises for a predetermined time period in response to a discharge timing signal BT. The substrate clock $\phi$b is applied to the substrate side of the solid state image sensor 1. When the substrate clock $\phi$b is active, the information charges stored in the light-receiving pixels of the light-receiving section 1$i$ are discharged toward the substrate side. Since the vertical transfer clock $\phi$v falls synchronously with the rising of the substrate clock $\phi$b, the discharge of information charges toward the substrate is smooth.

In this manner, information charges are stored in each light-receiving pixel of the light-receiving section 1$i$ during a period L, which starts from when the discharge of information charges in accordance with the substrate clock $\phi$b is completed to when transmission is commenced by the vertical transfer clock $\phi$v. The stored period of the information charges, or the shutter speed, is controlled by adjusting the timing of the substrate clock $\phi$b.

A timing controller 3 generates the vertical timing signal VT and the horizontal timing signal HT from a reference clock CK, which has a constant cycle, and sends the signals VT, HT to the clock generator 2. If, for example, the NTSC standard is employed, the timing controller 3 causes the horizontal timing signal HT to rise each time 910 reference clocks CK, which frequency is 14.32 MHz, are counted. The timing controller 3 also causes the vertical timing signal VT to fall each time 525/2 horizontal timing signals HT are counted. The timing controller 3 also causes the discharge timing signal BT to rise during the vertical scanning period based on exposure data indicating the exposure level of the solid state image sensor 1. The timing controller 3, for example, determines whether or not the exposure data, which is obtained by integrating the image signal Y(t) for every single display image unit, is within an optimal range. If the exposure data exceeds the exposure range, the rising timing of the pulse signals is delayed to shorten the storage period L of the information charges. On the other hand, if the exposure data has not yet reached the optimal level, the timing controller 3 advances the rise timing of the pulse signals to prolong the storage period L of the information charges.

The image sensor maintains the image signal Y(t) at an optimal level by changing the length of the period L, during which information charges are stored in the light-receiving section 1$i$, in accordance with the level of the image signal Y(t).

FIG. 3 is a cross-sectional view showing the light-receiving section 1$i$ of a CCD solid state image sensor which employs a vertical overflow drain structure to absorb excess information charges on the substrate side. A diffusion region (P-well region) 12 having a P type conductivity is formed on the surface region of a semiconductor substrate 11 which has an N type conductivity and where a drain region is to be formed. Formed on the surface of this P-well region 12 is a diffusion layer (buried layer) 13 which has an N type conductivity and where a channel region is to be formed.

The buried layer 13 is formed so as to be defined by an isolation region (not shown) on the surface of the P-well region 12 and to extend in one direction. First gate electrodes 15 are arranged at given intervals on the buried layer 13 via an insulating layer 14, and second gate electrodes 16 are arranged between the adjoining first gate electrodes 15 in such a way as to partially cover the first gate electrodes 15. The first and second gate electrodes 15, 16 are respectively supplied with four phase vertical clocks $\phi v$ ($\phi v1$–$\phi v4$), each of which has a phase difference of 90 degrees from one to another and are synchronous with a vertical sync signal VD. The semiconductor substrate 11 is supplied with the substrate clock $\phi b$. A ground voltage is applied to the P-well region 12. The peak values of the vertical clocks $\phi v1$–$\phi v4$ and the substrate clock $\phi b$, or the potentials at the gate electrodes 15, 16 and the semiconductor substrate 11, are set based on the P-Well region 12.

In the vertical overflow drain structure, when the light-receiving section 1$i$ stores information charges, the substrate clock $\phi b$ is kept low, and one to three of the vertical clocks ($\phi v1$–$\phi v4$) are kept high. This selectively activates the first and second gate electrodes 15, 16. In the part of the light-receiving section 1$i$ where the first and second gate electrodes 15, 16 are activated, as shown in FIG. 4, a potential well (depletion layer) is formed near the buried layer 13. Accordingly, information charges are stored in the region from within the buried layer 13 to the surface of the P-well region 12. In the part of the light-receiving section 1$i$ where the first and second gate electrodes 15, 16 are deactivated, a potential well is not formed in the buried layer 13 but a potential barrier for defining the light-receiving pixels is formed in the buried layer 13.

During the shutter operation for discharging the information charges stored in each of the light-receiving pixels, all of the vertical clocks $\phi v1$–$\phi v4$ are kept low and the substrate clock $\phi b$ rises. Consequently, the potential well in the buried layer 13 becomes shallower while the potential well in the semiconductor substrate 11 becomes deeper. As a result, the potential barrier in the P-well region 12 disappears as indicated by the broken line in FIG. 4. In this manner, the information charges stored in the potential well in the buried layer 13 are moved to the semiconductor substrate 11 from the buried layer 13 along the potential profile and are discharged therefrom.

In the solid state image sensor 1 having the vertical overflow drain structure, the output section 1$d$ and the light receiving section 1$i$ are formed on the same substrate. Thus, the substrate clock $\phi b$ affects the output portion 1$d$ during the shutter operation. Accordingly, the rise timing of the substrate clock $\phi b$ is set within the horizontal scanning return period in order to prevent noise from being mixed with the image signal Y(t) acquired from the output portion 1$d$. However, the horizontal scanning return period is very short, lasting only a few microseconds. Hence, if charges are stored in a large number of light-receiving pixels, all of the unnecessary charges in the light-receiving pixels may not be discharged and may thus remain in the light receiving pixels as residual charges. The residual charges may mix with the subsequently stored information charges and decrease the quality of the replayed display image.

SUMMARY OF THE INVENTION

Accordingly, it is an objective of the present invention to provide a method and apparatus for driving a solid state image sensor which completely discharges unnecessary charges during the shutter operation.

To achieve the above objective, the present invention provides a method for driving a solid state image sensor that obtains image signals in display image units. The solid state image sensor includes a semiconductor substrate and a semiconductor layer formed on the semiconductor substrate. The semiconductor layer has an opposite conductivity to the semiconductor substrate. The semiconductor layer has a plurality of parallel channel regions arranged therein. A plurality of transfer electrodes are arranged on the semiconductor substrate. Each transfer electrode intersects the plurality of channel regions. Each of the channel regions generates and accumulates information charges. The driving method includes the steps of accumulating information charges in the channel region that correspond to a transfer electrode selected by selectively activating the plurality of transfer electrodes at a predetermined timing during a vertical scanning return period, transferring the accumulated information charges to a transfer register, discharging the information charges in the channel regions toward the semiconductor substrate by keeping the plurality of transfer electrodes deactivated and increasing the potential at the semiconductor substrate, and repetitively executing the accumulating, transferring, and discharging steps to continuously obtain the image signals in display image units.

In a further aspect of the present invention, the present invention provides an apparatus for driving a solid state image sensor that obtains image signals in display image units. The solid state image sensor includes a semiconductor substrate and a semiconductor layer formed on the semiconductor substrate. The semiconductor layer has an opposite conductivity to the semiconductor substrate. The semiconductor layer has a plurality of parallel channel regions arranged therein. A plurality of transfer electrodes are arranged on the semiconductor substrate. Each transfer electrode intersects the plurality of channel regions. Each of the channel regions generates and accumulates information charges. The driving apparatus includes a timing controller for generating a predetermined timing signal based on a reference clock signal, and a clock generator for generating a vertical clock signal and a substrate clock signal based on the timing signal and applying the vertical clock signal and the substrate clock signal to the solid state image sensor. The clock generator activates the vertical clock signal so that the transfer electrodes are selectively activated and the information charges are accumulated in the channel regions corresponding to the activated transfer electrode, and deactivates the vertical clock signal so that the transfer electrodes are maintained in a deactivation state after transfering the stored information charges. The the clock generator further activates the substrate clock signal so that the potential of the semiconductor substrate is increased and the information charges in the channel region are discharged when the transfer electrode is deactivated.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 8:
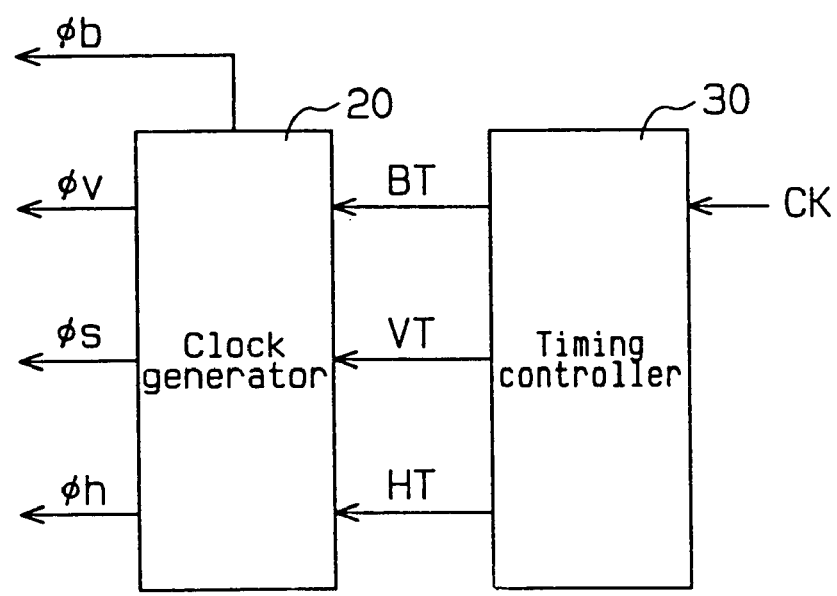
FIG. 8 schematic block diagram of a timing control circuit according to the present invention.

Reffering to FIG. 8, a clock generator 20 and a timing controller 30 are shown. The timing controller 30 receives a reference clock signal CK and generates predetermined timing signals (horizontal timing signal HT, vertical timing signal VT and discharge timing signal BT) based on the reference clock signal CK. The clock generator 20 generates a vertical transfer clock $\phi v$, a storage transfer clock $\phi s$, and a horizontal transfer clock $\phi h$ based on the timing signals HT, VT. The clock generator 20 sends the vertical transfer clock $\phi v$ and the horizontal transfer clock $\phi h$ to the solid state image sensor. The clock generator 20 also generates a substrate clock signal $\phi b$ in responce to the discharge timing signal BT. The timing controller 30 also causes the discharge timing signal BT to rise during the vertical scanning period based on exposure data indicating the exposure level of the solid state image sensor.

Figure 1:
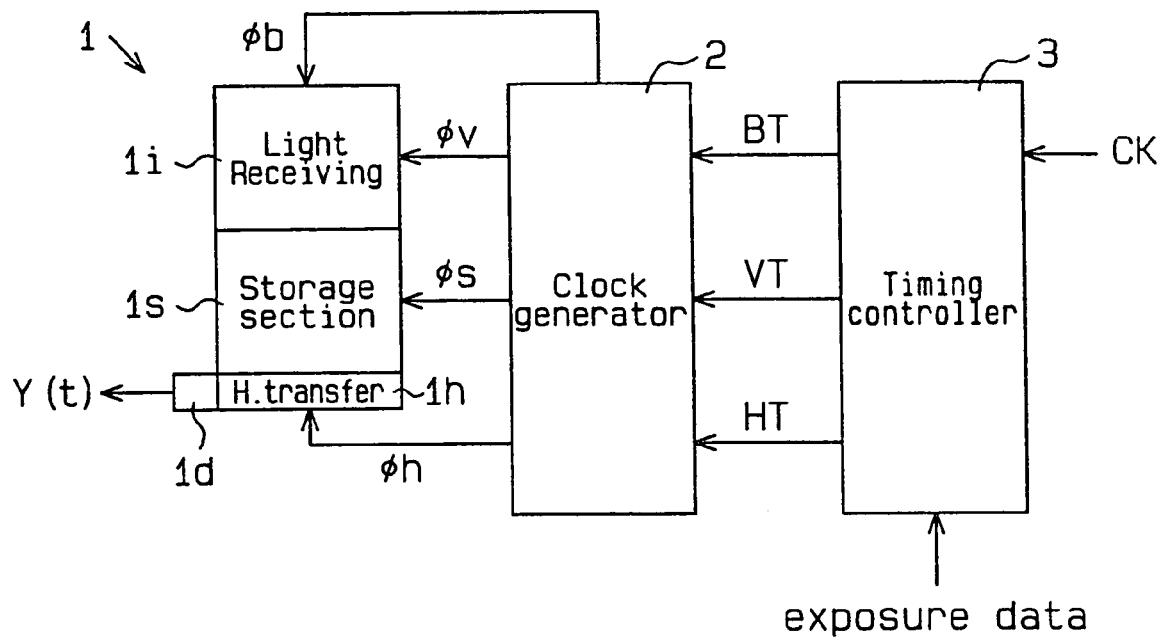
FIG. 1 is a block diagram showing an image apparatus employing a prior art solid state image sensor.
Figure 2:
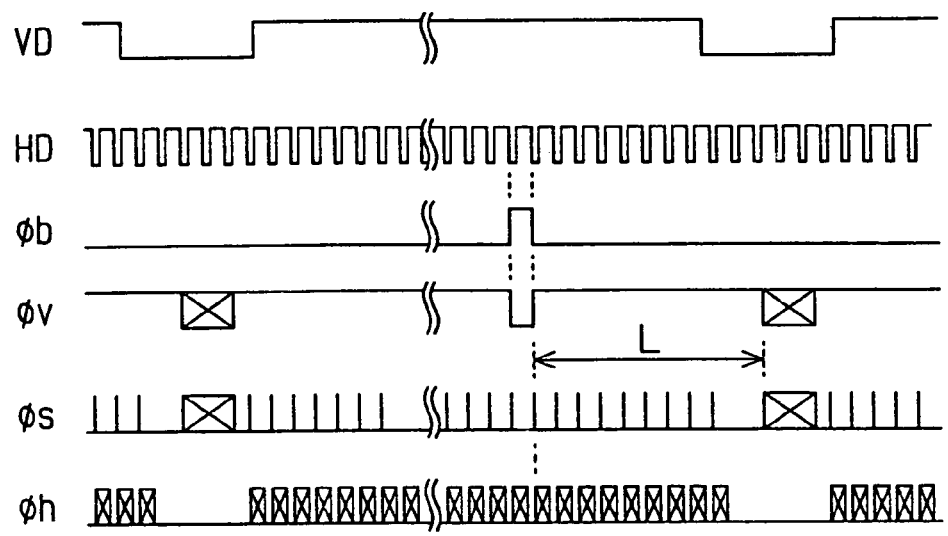
FIG. 2 is a timing chart illustrating the operation of the image apparatus of FIG. 1.
Figure 3:
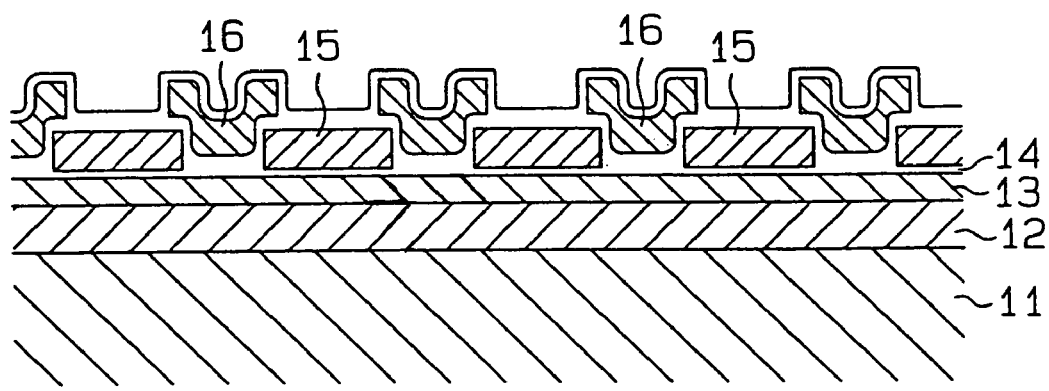
FIG. 3 is a cross-sectional view showing a light-receiving section of a prior art solid state image sensor having a vertical overflow drain structure.

A method for driving a solid state image sensor according to the present invention will now be described with reference to FIGS. 5 to 7. The structure of the solid state image sensor is essentially the same as that of the prior art image sensor shown in FIG. 1, except that the control signals or clocks generated by the timing controller 3 and the clock generator 2 are activated as described below.

In the driving method according to the present invention, the frame transfer type solid state image sensor first keeps the transfer electrodes, which form the light-receiving pixels, deactivated and discharges the residing charges. The electronic shutter operation then discharges substantially all of the residing information charges. The transfer electrodes are then activated to store new information charges. In other words, when the transfer electrodes are activated in the frame transfer type solid state image sensor, a potential well is formed in the channel region below the transfer electrodes so that the functions of the light-receiving pixels become effective. The light-receiving pixels function effectively only during the storage period L of the information charges.

Figure 4:
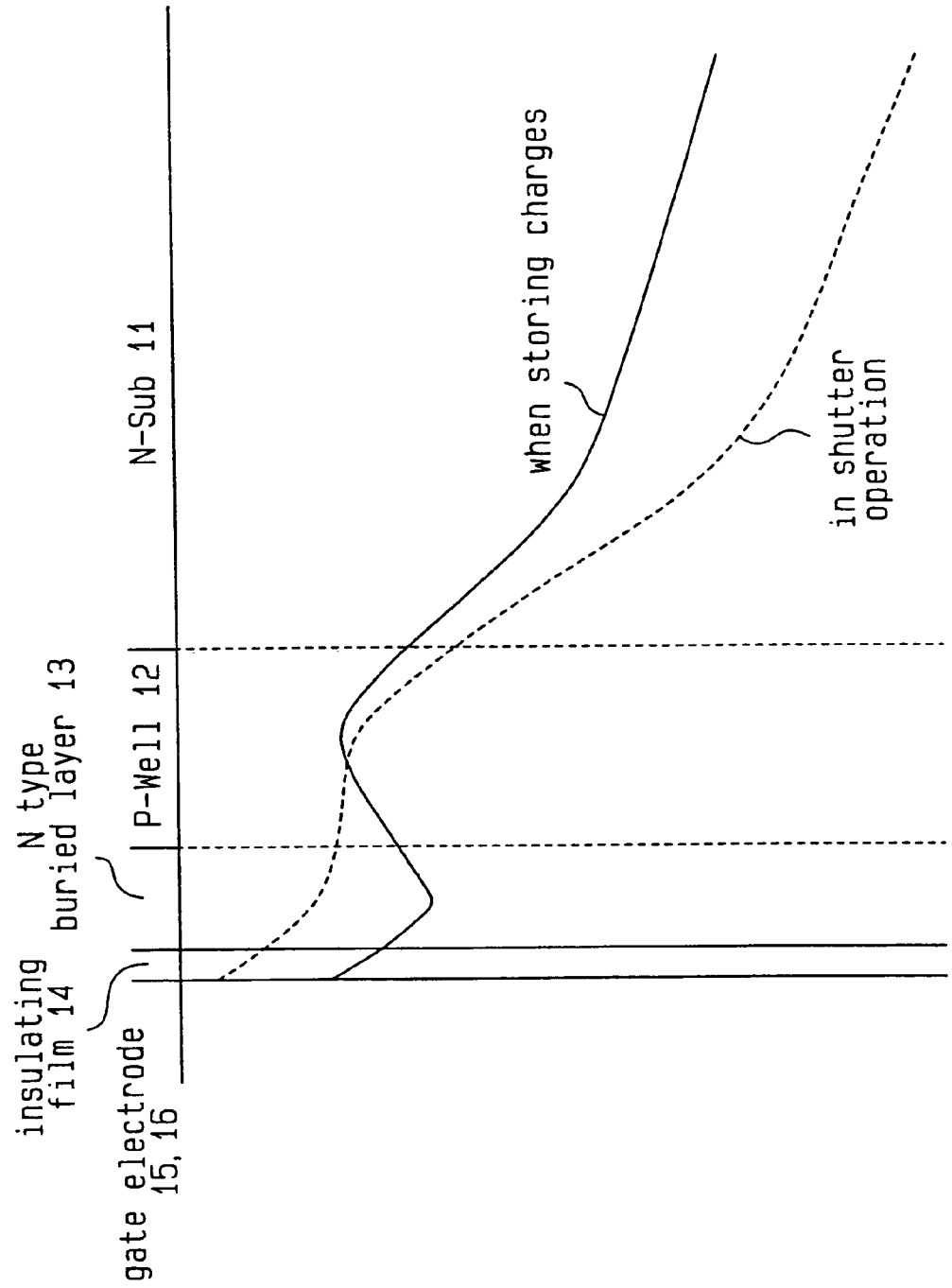
FIG. 4 is a diagram showing potential changes in the solid state sensor of FIG. 3 in the vertical direction.

The transfer output of the information charges from the light-receiving section to the storage section, or the frame transfer is set during the blanking period of the vertical sync signal VD. After the frame transfer is completed, the four phase vertical clocks $\phi v1$–$\phi v4$ are fall, which deactivates all of the transfer electrodes. In this state, the substrate clock $\phi b$ is fixed to the low level. This state is maintained until a shutter trigger ST rises. The timing of the shutter trigger ST is set based on the exposure level of the image sensor, or the exposure information indicating the average level of the image signal output by the image sensor, in the same manner as the prior art solid state image sensor shown in FIG. 4.

Figure 5:
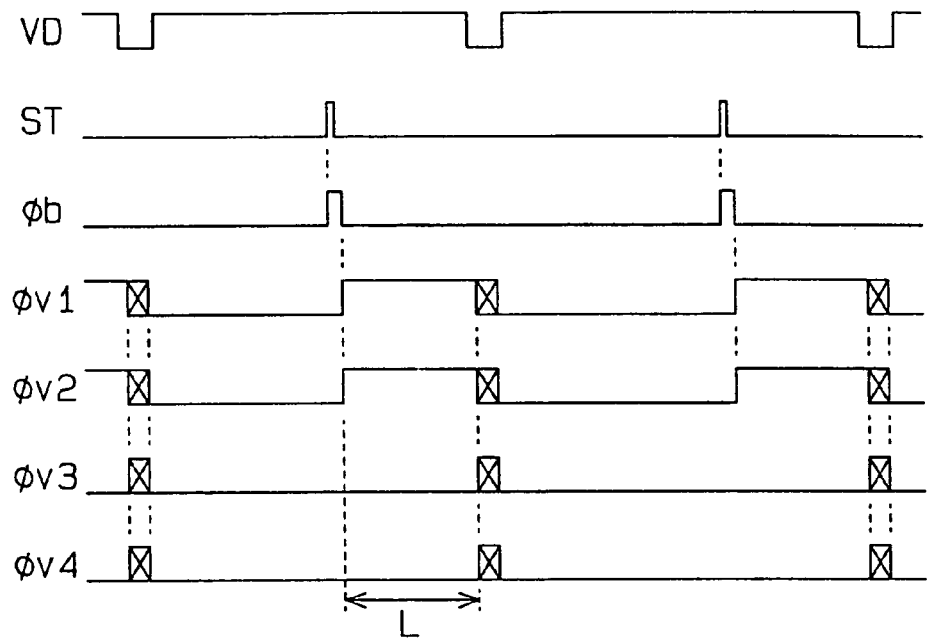
FIG. 5 is a timing chart illustrating a method for driving a solid state image sensor according to the present invention.

As shown in FIG. 5, when the shutter trigger ST rises during the vertical scanning period, the substrate clock $\phi b$ rises. This discharges the information charges residing in the channel region below the transfer electrodes toward the substrate. The substrate clock $\phi b$ remains high over a predetermined period. Unnecessary residual information charges are discharged during this period. Among the four phase vertical transfer clocks $\phi v1$–$\phi v4$, for example, the first phase and second phase clocks $\phi v1$, $\phi v2$ rise synchronously with the falling of the substrate clock $\phi b$. This forms the potential well below the transfer electrodes to which the vertical transfer clocks $\phi v1$, $\phi v2$ are applied. The potential barrier is formed below the transfer electrodes to which the vertical transfer clocks $\phi v3$, $\phi v4$ are applied. The rise and fall timing of each vertical transfer clock is set within the horizontal scanning return period to prevent noise from mixing with the image signal.

The information charges generated by photoelectric conversion in the channel region are stored in the potential well. The accumulation of the information charges is maintained during the blanking period of the vertical sync signal VD until the frame transfer is commenced. Accordingly, the information charges generated in the channel regions are stored in the potential well during the period L from when the first and second phase clocks $\phi v1$, $\phi v2$ rise to when the frame transfer is commenced.

Figure 6A:
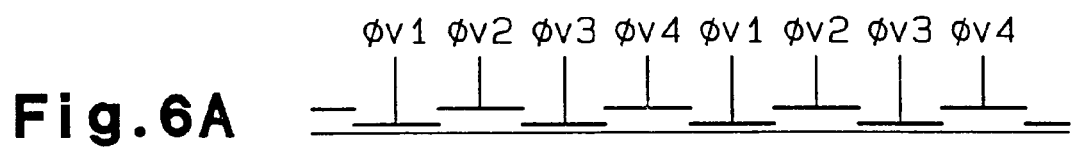
FIG. 6 is a diagram showing potential changes when employing the solid state image sensor driving method according to the present invention.
Figure 6A:
Figure 6B:
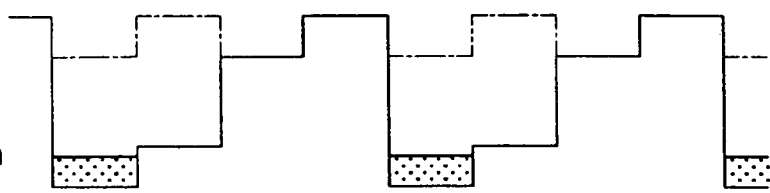
Figure 7:
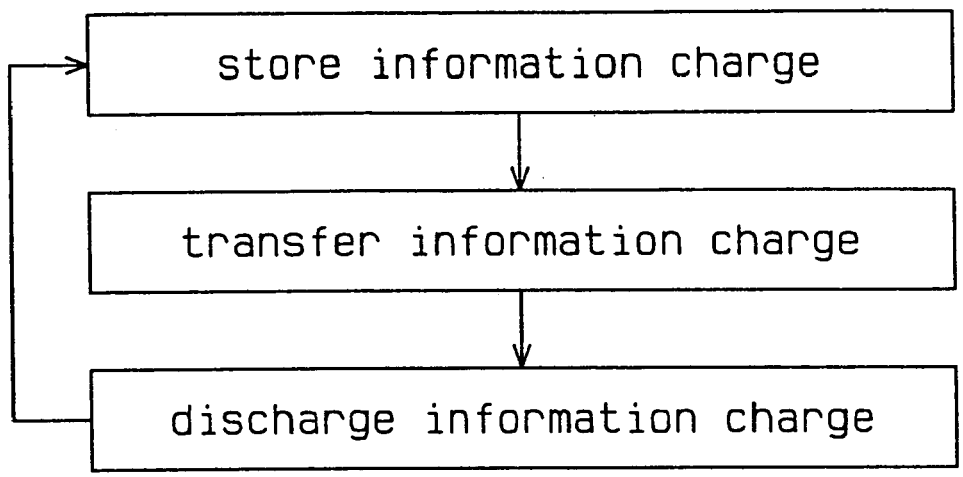
FIG. 7 is a flowchart illustrating the method for driving the solid state image sensor.

As shown in FIG. 6A, the preferred drive method substantially prevents the formation of the potential well in the channel region during the period from when the frame transfer is completed to when the storage of the information charges is commenced. Thus, even if incident light in the channel region generates information charges, most of those charges are discharged toward the substrate side. As a result, only the subtle amount of charges residing in the channel region need be discharged toward the substrate side when the substrate clock $\phi b$ rises to start the shutter operation. Accordingly, substantially all of the unnecessary information charges residing in the channel region are discharged even if the shutter operation is fast. This prevents unnecessary information charges from residing in the channel region. Furthermore, since the amount of charges discharged during the shutter operation is small, the charges are discharged sufficiently even if the potential of the substrate clock $\phi b$ is low.

In the vertical overflow drain structure solid state image sensor of the preferred embodiment, the discharge of unnecessary charges is completed within a short period of time and unnecessary charges are thus prevented from residing in the channel region when the shutter operation is performed. Furthermore, the small amount of charges that are discharged during the shutter operation allows the voltage required for the shutter operation to be set at a low value. This decreases power consumption.

In the preferred embodiment, all of the transfer electrodes remain deactivated from when the frame transfer is completed to when the storage of the information charges is commenced in order to prevent the formation of the potential well in each channel region. Thus, the charges generated in the channel regions are discharged toward the substrate regardless of the intensity of the incident light at the channel regions. In other words, all of the charges in the channel regions are easily discharged toward the semiconductor substrate when the potential at the semiconductor substrate increases.

The preferred embodiment employs four phase vertical transfer clocks. However, three phase or five phase transfer clocks may be employed.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A method for driving a solid state image sensor that provides image signals in display image units, wherein the solid state image sensor includes a semiconductor substrate, a semiconductor layer formed on the semiconductor substrate and having an opposite conductivity to the semiconductor substrate, the semiconductor layer having a plurality of parallel channel regions arranged therein, and a plurality of transfer electrodes arranged on the semiconductor substrate each intersecting the plurality of channel regions, wherein each of the channel regions generates and accumulates information charges, the driving method comprising the steps of:

storing information charges in the channel region that correspond to a transfer electrode selected by selectively activating the plurality of transfer electrodes at a predetermined timing during a vertical scanning period;

transferring the stored information charges to a transfer register;

deactivating the plurality of transfer electrodes;

discharging, after said deactivating operation, the information charges in the channel regions toward the semiconductor substrate by keeping the plurality of transfer electrodes deactivated and increasing the potential at the semiconductor substrate; and repetitively executing the storing, transferring, deactivating, and discharging steps to continuously obtain the image signals in display image units.

2. The driving method according to claim 1, wherein the potential at the semiconductor substrate is raised just before the next storing step.

3. The driving method according to claim 1, wherein a potential well having a predetermined depth is formed in the selected channel region during the storing step to store the information charges.

4. The driving method according to claim 3, wherein the potential well is prevented from being formed in the discharging step.

5. An apparatus for driving a solid state image sensor that provides image signals in display image units, wherein the solid state image sensor includes a semiconductor substrate, a semiconductor layer formed on the semiconductor substrate and having an opposite conductivity to the semiconductor substrate, the semiconductor layer having a plurality of parallel channel regions arranged therein, and a plurality of transfer electrodes arranged on the semiconductor substrate each intersecting the plurality of channel regions, wherein each of the channel regions generates and accumulates information charges, the driving apparatus comprising:

a timing controller for generating a predetermined timing signal based on a reference clock signal; and a clock generator for generating a vertical clock signal and a substrate clock signal based on the timing signal and applying the vertical clock signal and the substrate clock signal to the solid state image sensor, wherein the clock generator activates the vertical clock signal so that the transfer electrodes are selectively activated and the information charges are accumulated in the channel regions corresponding to the activated transfer electrode, deactivates the vertical clock signal so that the transfer electrodes are maintained in a deactivation state after transferring the stored information charges, and then activates the substrate clock signal so that the potential of the semiconductor substrate is increased and the information charges in the channel region are discharged while keeping the plurality of transfer electrodes deactivated.

6. The driving apparatus according to claim 5, wherein the clock generator activates the substrate clock signal to raise the potential at the semiconductor substrate except when the information charges are stored.

7. The driving apparatus according to claim 5, wherein the clock generator keeps the substrate clock signal deactivated to keep the plurality of transfer electrodes deactivated except when the information charges are stored.

* * * * *